United States Patent [19]

Ito et al.

[11] Patent Number: 5,416,630
[45] Date of Patent: May 16, 1995

[54] CIRCULAR ARC ILLUMINATION APPARATUS

[75] Inventors: Tatsuo Ito, Osaka; Toshiyuki Watanabe, Neyagawa; Masaki Suzuki, Hirakata, all of Japan

[73] Assignee: Matsushita Electric Industrial Co., Ltd., Osaka, Japan

[21] Appl. No.: 70,170

[22] Filed: Jun. 2, 1993

[30] Foreign Application Priority Data

Jun. 3, 1992 [JP] Japan .................................. 4-142323

[51] Int. Cl.⁶ .............................................. G02B 26/08
[52] U.S. Cl. ....................................... 359/208; 359/212; 359/221; 362/298; 358/474; 250/236
[58] Field of Search ............... 359/208, 205, 197–199, 359/212–213, 214, 221, 223, 226, 216, 217, 864, 219; 250/236; 362/216, 296, 297, 298, 346, 347, 350, 268, 300, 307; 355/67; 358/474, 493; 348/205

[56] References Cited

U.S. PATENT DOCUMENTS

| | | | |
|---|---|---|---|
| 4,458,302 | 7/1984 | Shiba et al. | 362/298 |
| 4,572,659 | 2/1986 | Omata | 359/894 |
| 4,759,593 | 7/1988 | Kessler | 359/208 |
| 4,941,719 | 7/1990 | Hisada et al. | 359/205 |
| 4,947,030 | 8/1990 | Takahashi | 362/268 |
| 5,255,114 | 10/1993 | Kessler | 359/208 |

FOREIGN PATENT DOCUMENTS

54-123877  9/1979  Japan .
57-200012 12/1982  Japan .

*Primary Examiner*—Loha Ben
*Assistant Examiner*—James Phan
*Attorney, Agent, or Firm*—Wenderoth, Lind & Ponack

[57] ABSTRACT

A circular arc illumination apparatus includes a light source section for emitting rays, a condensing optical system for condensing the rays emitted by the light source section, a rotating mirror driven by a motor and reflecting the condensed rays from the condensing optical system, and a circular arc-shaped bending mirror for reflecting the rays reflected by the rotating mirror toward a mask so that the rays become incident on the mask. The apparatus effectively utilizes light emitted by the light source section, exposes an object uniformly, and is practical and economical for exposing a large substrate.

3 Claims, 6 Drawing Sheets

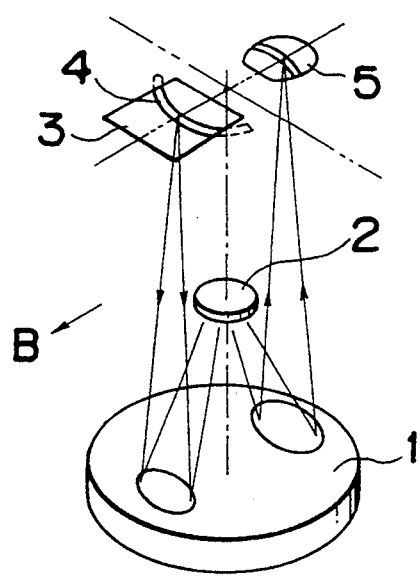
Fig. 4 - PRIOR ART

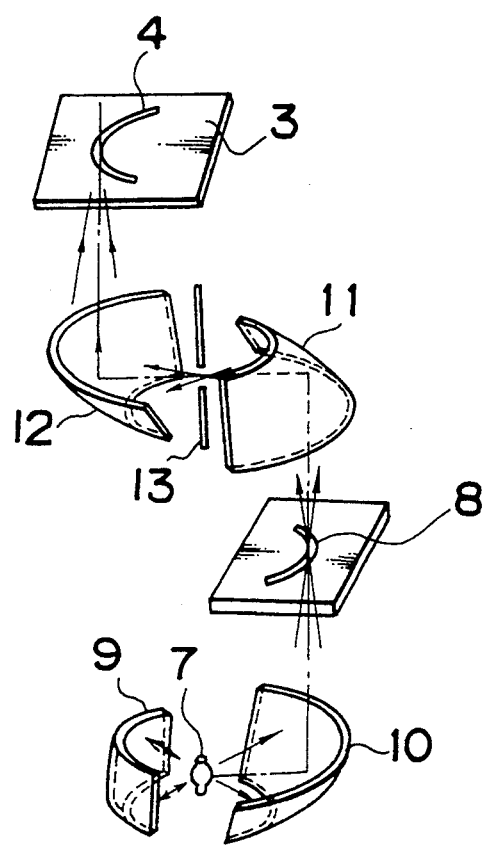
Fig. 5 - PRIOR ART

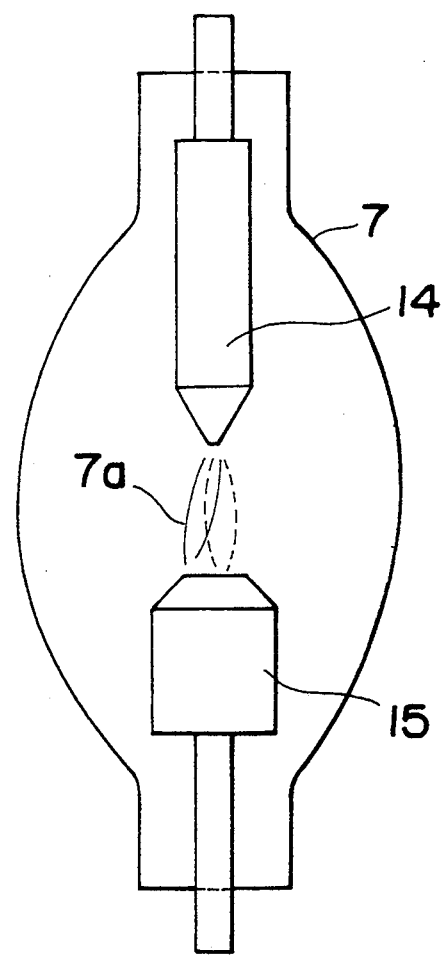
Fig. 6 - PRIOR ART

CIRCULAR ARC ILLUMINATION APPARATUS

BACKGROUND OF THE INVENTION

The present invention relates to a circular arc illumination apparatus such as reflection type of projection aligner, and more particularly to a circular arc illumination apparatus for exposing a large substrate such as a liquid crystal display device having a large screen.

FIG. 4 shows the projection optical system of a conventional 1:1 reflection type of projection aligner comprising a concave mirror 1 and a convex mirror 2. A mask 3 is irradiated by circular arc slit illumination light 4 so as to project the pattern of the mask 3 on a substrate 5. The mask 3 and the substrate 5 are scanned in a direction shown by an arrow B and the direction opposite thereto. The circular arc slit illumination light is generated by enlarging the image produced by light from a circular arc lamp or by using a symmetrical reflecting mirror to scan light produced by a point light source. The latter optics are effective when using ultraviolet rays. This kind of optical system is disclosed in Japanese Laid-Open Patent Publication Nos. 54-123877 and 57-20012. The apparatus disclosed in the former publication has a spherical mirror, and the apparatus disclosed in the latter publication has a four-way curved surface mirror constituted by rotating an elliptical mirror. FIG. 5 shows a circular arc illumination apparatus for obtaining circular arc illumination. The apparatus comprises reflecting mirrors 10, 11, and 12 serving as a spherical mirror and a four-way curved surface mirror; a point light source 7; a slit 8; a spherical reflecting mirror 9; and a pin hole 13.

The conventional apparatuses have the following three disadvantages. The first disadvantage is a lack of uniformity in the illumination. FIG. 6 shows discharge electrodes 14 and 15 of the point light source 7. The emission of the point light source 7 is generated by an arc 7a produced between the electrodes 14 and 15. The discharge position on the surface of the electrode 15 changes with the lapse of time. As a result, the position of the spot light source is nonuniform. Accordingly, the image of the point light source 7 formed via the reflecting mirror 10 shown in FIG. 5 varies, which results in nonuniform illumination. The second disadvantage is inefficiency in the utilization of light because a luminous flux is shaped by the circular arc slit. The third disadvantage is cost and difficulty in manufacture. With respect to the process of exposing a large liquid crystal substrate, which type of substrate has been the subject of research and development in recent years, there are demands for large optical instruments such as a large reflecting mirror which produces a large quantity of circular arc illumination light. Therefore, the cost for manufacturing the apparatus is inevitably high and further, it is difficult to manufacture the apparatus.

SUMMARY OF THE INVENTION

It is an object of the present invention to provide a circular arc illumination apparatus which efficiently utilizes light emitted by a light source.

It is another object of the present invention to provide a circular arc illumination apparatus which exposes an object uniformly.

It is still another object of the present invention to provide a practical circular arc illumination apparatus useful for exposing a large substrate.

In accomplishing these and other objects, there is provided a circular arc illumination apparatus comprising: a light source section for emitting rays of light; a condensing optical system for condensing the rays emitted by the light source section; a rotating mirror driven by a motor and reflecting the condensed rays propagating from the condensing optical system; and a circular arc-shaped bending mirror for reflecting the rays reflected by the rotating mirror onto a mask so that the rays are incident on the mask.

According to the above-described apparatus, rays emitted by the light source section are converged by the condensing optical system and reflected by the rotating mirror, thus generating a pattern of light in the form of an arc of a circle, the center of which coincides with the rotary shaft of the rotating mirror. The rays reflected by the circular arc-shaped bending mirror are incident on the mask at a right angle thereto, and thus scan the object along a circular arc.

BRIEF DESCRIPTION OF THE DRAWINGS

These and other objects and features of the present invention will become clear from the following description of preferred embodiments made with reference to the accompanying drawings, in which:

FIG. 4 is a schematic diagram of the projection optical system of a conventional reflection type of 1:1 projection aligner;

FIG. 5 is a schematic diagram of a conventional circular arc illumination apparatus; and FIG. 6 illustrates discharge electrode of a point light source of a conventional circular arc illumination apparatus.

DETAILED DESCRIPTION OF THE INVENTION

Figure 1:
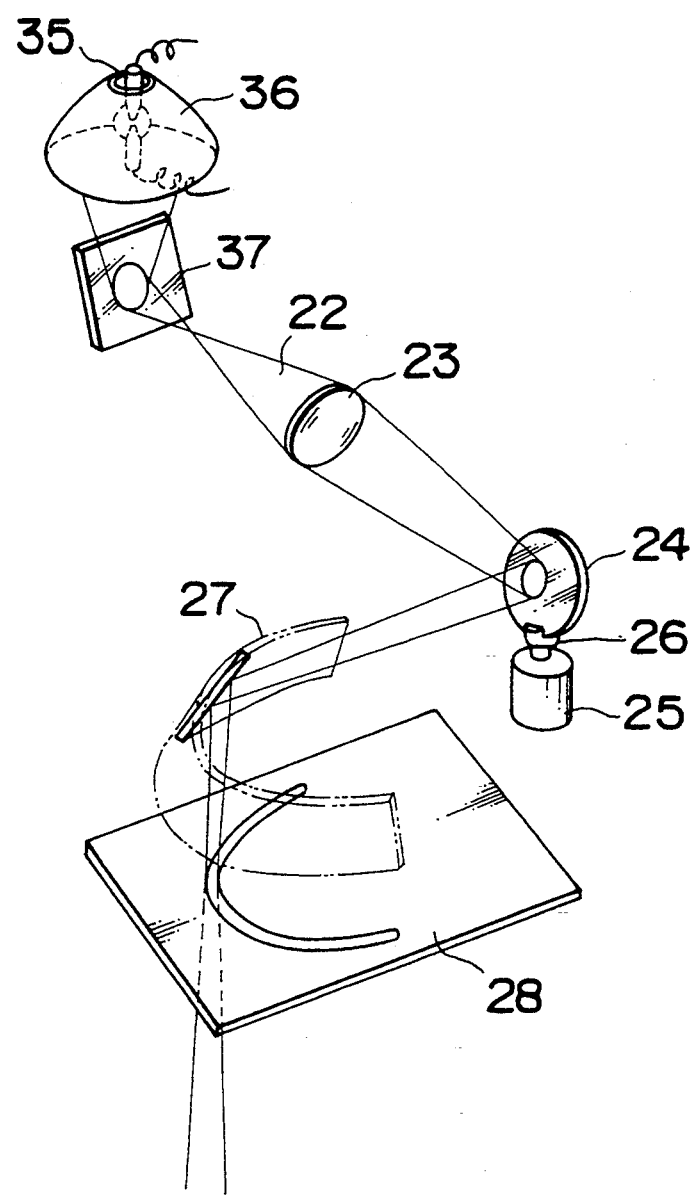
FIG. 1 is a perspective view of a first embodiment of a circular arc illumination apparatus according to the present invention.

Before the description of the present invention proceeds, it is to be noted that like parts are designated by like reference numerals through the accompanying drawings.

Figure 2:
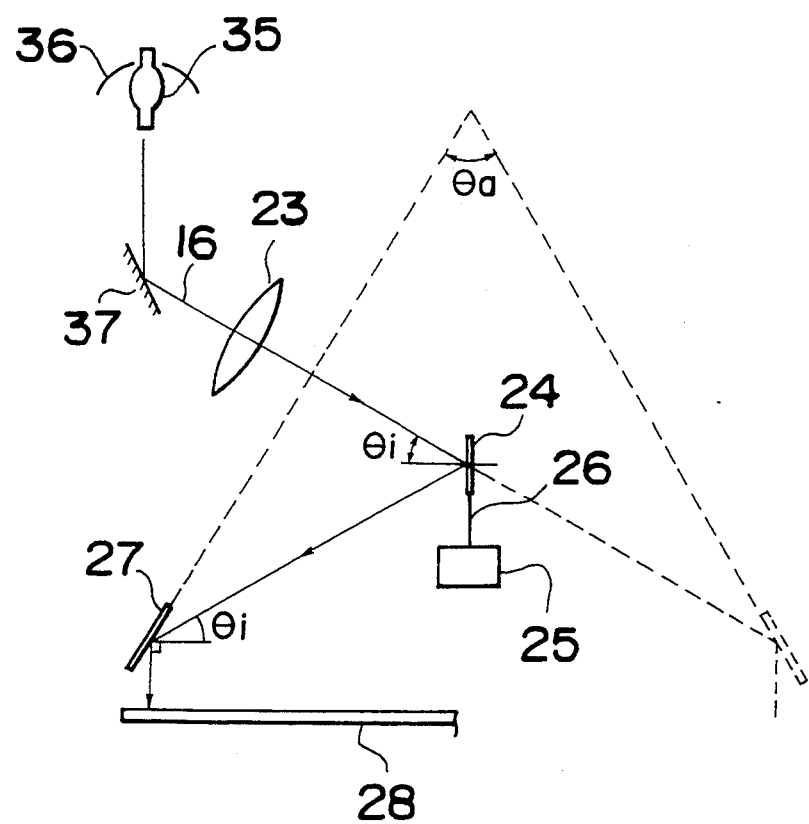
FIG. 2 is a schematic diagram of the first embodiment of the circular arc illumination apparatus.

Referring now to FIGS. 1 and 2, a circular arc illumination apparatus according to the present invention comprises an elliptical mirror 36 and a planar mirror 37, a condensing optical system 23, a rotating mirror 24, a motor 25, a mirror holder 26, and a bending mirror 27. The elliptical mirror 36 and the planar mirror 37 reflect a ray 22 emitted by a light source 35 consisting of an extra-high pressure mercury lamp, an ultraviolet laser or the like. The condensing optical system 23 is shown in FIG. 1 as a refracting optical system. However, the condensing optical system 23 may consist of a reflecting optical system. The rotating mirror 24 is formed by evaporating aluminum, having a high reflectivity even over the ultraviolet region of the spectrum, over both surfaces of a thin glass plate, and is provided along the optical path. The motor 25 is equipped with a rotary encoder for monitoring the rotational speed of the motor 25 and the rotational angle thereof. The mirror holder 26 connects the rotating mirror 24 and the motor 25 with each other so that the rotating mirror 24 is rotated by the motor 25. The bending mirror 27 lies along a part of a cone, the axis of which coincides with the shaft of the motor 25. A mask 28 to be exposed is disposed below the bending mirror 27. Rays scan the mask 28 according to the rotation of the rotating mirror 24.

The bending mirror 27 is described below in detail with reference to FIG. 2. Reference numeral 16 denotes a principal ray emitted by the light source 35. In this embodiment, rays of light emitted by the light source 35 and reflected by the elliptical mirror 36 are reflected by the mirror 37 and condensed by the condensing lens 23 to form condensed rays, and then the condensed rays are reflected by the rotating mirror 24 and the bending mirror 27, thus traveling to the mask 28 so as to scan the mask 28 according to the rotation of the rotating mirror 24. The rays on the mask 28 form an arc of a circle as the scanned locus, the center of which circle coincides with the shaft of the motor 25. Supposing that the principal ray 16 is incident on the rotating mirror 24 at an angle of $\theta_i$, the vertex angle $\theta_a$ of the cone along which the bending mirror 27 lies is $90°-\theta_i$. When the rotating mirror 24 rotates, rays are reflected from only a portion of the entire surface of the bending mirror 27. The rays incide on the mask 28 at a right angle thereto and form thereon an arc of a circle, the center of which coincides with the shaft of the motor 25. In this embodiment, the rear surface of the rotating mirror 24 also serves as a mirror. Therefore, the mask 28 can be scanned twice per rotation of the rotating mirror 24. Thus, the load applied to the motor 25 may be reduced.

As described above, load is applied to the motor 25 to a small extent because a line normal to the rotating mirror is perpendicular to the rotary shaft 26.

Figure 3:
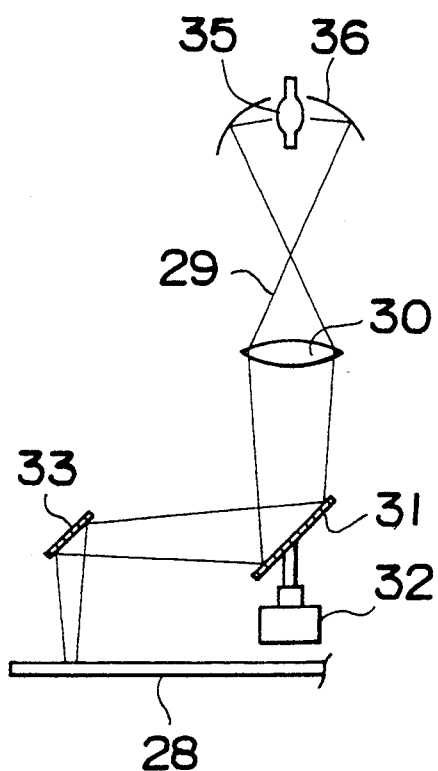
FIG. 3 is a schematic diagram of a second embodiment of a circular arc illumination apparatus according to the present invention.

A second embodiment of the present invention will now be described below with reference to FIG. 3. Reference numeral 29 denotes a ray emitted by the light source 35. The apparatus comprises a condensing optical system 30 shown in FIG. 3 as a refracting optical system. However, the condensing optical system 30 may consist of a reflecting optical system. The apparatus further comprises a rotating mirror 31 formed by evaporating aluminum, having a high reflectivity over the ultraviolet region of the spectrum, over both surfaces of a thin glass plate; a motor 32; and a bending mirror 33 lying along part of a cone. The second embodiment has the same structure as that of the first embodiment except that the line normal to the surface of the rotating mirror 31 extends obliquely relative to the rotary shaft.

Rays 29 are condensed by the condensing optical system 30 and are directed onto the bending mirror 33 by the rotating mirror 31 provided along the optical path. The optical axis of the rays 29 are coincident with that of the rotating mirror 31. Then, the rays 29 incide on the mask 28 at an angle perpendicular thereto. Similarly to the first embodiment, the rays scan the mask 28 in a circular arc configuration. As described above, the rotating mirror 31 forms an angle, for example, preferably 45°, to the rotary shaft. Therefore, the center of the circle along which the locus of the rays extends does not fluctuate and the size of the rotating mirror can be reduced.

In the first embodiment, a rotating polygon mirror or the like of a laser scanner can be used instead of the rotating planar mirror to provide a similar effect.

As described above, according to the present invention, there is no need for providing a slit in the form of a circular arc as in the conventional apparatus. Thus, rays can be efficiently utilized to scan an object. In addition, the illuminance is made uniform by scanning the object repeatedly. Moreover, a small optical system suffices for scanning the object.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims.

What is claimed is:

1. A circular arc illumination apparatus comprising:
   a light source section including a light source, an elliptical mirror positioned to reflect rays emitted from the light source, and a planar mirror positioned to reflect the rays reflected by the elliptical mirror;
   optical condensing means for condensing the rays emitted by the light source section;
   a reflecting mirror positioned to reflect the rays condensed by the optical condensing means;
   a motor connected to said reflecting mirror so as to rotate the reflecting mirror; and
   a circular arc-shaped bending mirror positioned to reflect rays reflected by the reflecting mirror toward a mask so that the rays become incident on the mask.

2. The circular arc illumination apparatus as claimed in claim 1, wherein the circular arc-shaped bending mirror lies along a portion of a cone having a vertex angle of $90°-\theta_i$, $\theta_i$ being an angle at which rays are incident on the reflecting mirror.

3. The circular arc illumination apparatus as claimed in claim 1, wherein a line normal to the reflecting mirror is perpendicular to an axis about which said motor rotates the reflecting mirror thereof.

* * * * *